US010685081B2

(12) United States Patent
Chattopadhyay et al.

(10) Patent No.: US 10,685,081 B2
(45) Date of Patent: Jun. 16, 2020

(54) OPTIMIZED DATA DISCRETIZATION

(71) Applicant: Intel Corporation, Santa Clara, CA (US)

(72) Inventors: Rita Chattopadhyay, Chandler, AZ (US); Ravindra V. Narkhede, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 409 days.

(21) Appl. No.: 15/628,123

(22) Filed: Jun. 20, 2017

(65) Prior Publication Data

US 2018/0365193 A1   Dec. 20, 2018

(51) Int. Cl.

| | |
|---|---|
| *G06F 17/50* | (2006.01) |
| *G06F 17/12* | (2006.01) |
| *G06F 16/903* | (2019.01) |
| *H03M 7/30* | (2006.01) |
| *G06T 9/00* | (2006.01) |
| *G06F 30/23* | (2020.01) |

(52) U.S. Cl.
CPC ............ *G06F 17/12* (2013.01); *G06F 16/903* (2019.01); *G06F 30/23* (2020.01); *G06T 9/005* (2013.01); *H03M 7/30* (2013.01); *H03M 7/3059* (2013.01)

(58) Field of Classification Search
CPC ........ G06F 16/217; G06F 13/203; G06N 5/02
USPC ................... 703/2, 5, 22, 24; 706/10, 11, 12
See application file for complete search history.

(56) References Cited

U.S. PATENT DOCUMENTS

| | | | | |
|---|---|---|---|---|
| 5,508,706 | A * | 4/1996 | Tsou .................... | B60Q 1/0023 342/110 |
| 6,674,908 | B1 * | 1/2004 | Aronov ............... | H03M 7/3088 382/232 |
| 6,941,287 | B1 * | 9/2005 | Vaidyanathan ...... | G06K 9/6229 706/12 |
| 7,260,487 | B2 * | 8/2007 | Brey .................... | G06F 1/3203 702/60 |
| 9,418,408 | B1 * | 8/2016 | Thompson ............. | G06T 5/009 |
| 2006/0177131 | A1 * | 8/2006 | Porikli .................... | G06F 17/18 382/168 |
| 2007/0124094 | A1 * | 5/2007 | Brey ..................... | G06F 1/3203 702/60 |
| 2015/0379429 | A1 * | 12/2015 | Lee ........................ | G09B 5/00 706/11 |
| 2016/0042294 | A1 * | 2/2016 | Macready .............. | G06N 5/02 706/10 |

(Continued)

*Primary Examiner* — Thai Q Phan
(74) *Attorney, Agent, or Firm* — Alliance IP, LLC

(57) ABSTRACT

In one embodiment, an apparatus comprises a memory and a processor. The memory is to store data. The processor is to: store a first dataset on the memory; identify a plurality of bin sizes for compressing the first dataset; compute a plurality of performance costs associated with the plurality of bin sizes; identify a minimum performance cost of the plurality of performance costs; identify an optimal bin size based on the particular bin size associated with the minimum performance cost; partition the first dataset into a plurality of bins based on the optimal bin size; identify a plurality of bin counts associated with the plurality of bins; generate a second dataset based on the plurality of bin counts, wherein the second dataset is smaller than the first dataset; and store the second dataset on the memory, wherein the second dataset is stored using less memory space than the first dataset.

25 Claims, 12 Drawing Sheets

(56) References Cited

U.S. PATENT DOCUMENTS

| | | | |
|---|---|---|---|
| 2016/0242690 A1* | 8/2016 | Principe | A61B 5/742 |
| 2017/0249342 A1* | 8/2017 | Dembla | G06F 16/217 |
| 2017/0249375 A1* | 8/2017 | Dembla | G06F 16/217 |

* cited by examiner

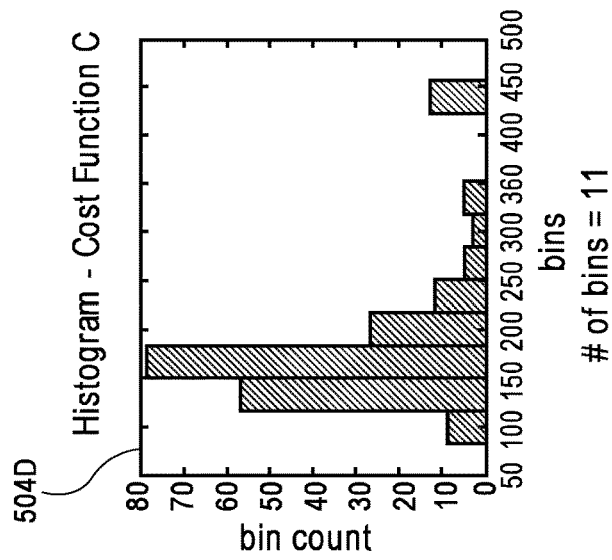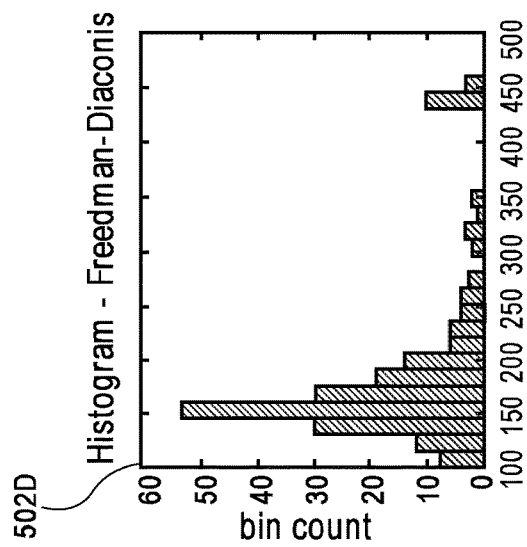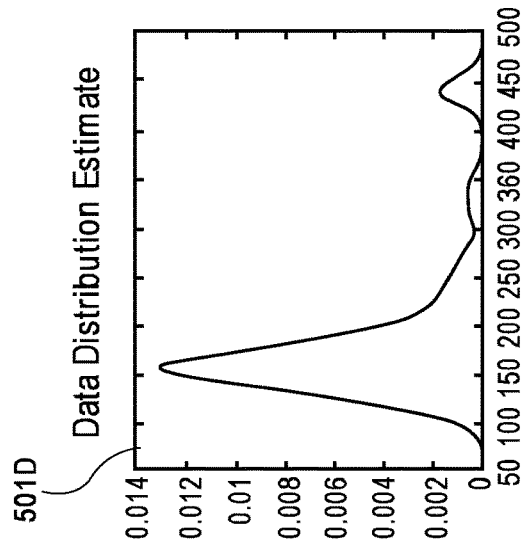
FIG. 5D

OPTIMIZED DATA DISCRETIZATION

FIELD OF THE SPECIFICATION

This disclosure relates in general to the field of computer processing, and more particularly, though not exclusively, to data analytics.

BACKGROUND

Data analytics has a wide range of applications in computing systems (e.g., from data mining to machine learning and artificial intelligence), and is an increasingly important aspect of many large-scale computing applications. Data discretization is an important preprocessing step for certain data analytics applications, and may involve grouping a collection of values into a smaller number of "bins" that each correspond to a particular data interval or range. It can be challenging, however, to determine an appropriate size for the intervals or "bins" that are used to perform data discretization.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIGS. 5A-E provide a comparison of various data discretization approaches in a variety of use cases.

EMBODIMENTS OF THE DISCLOSURE

Figure 1:
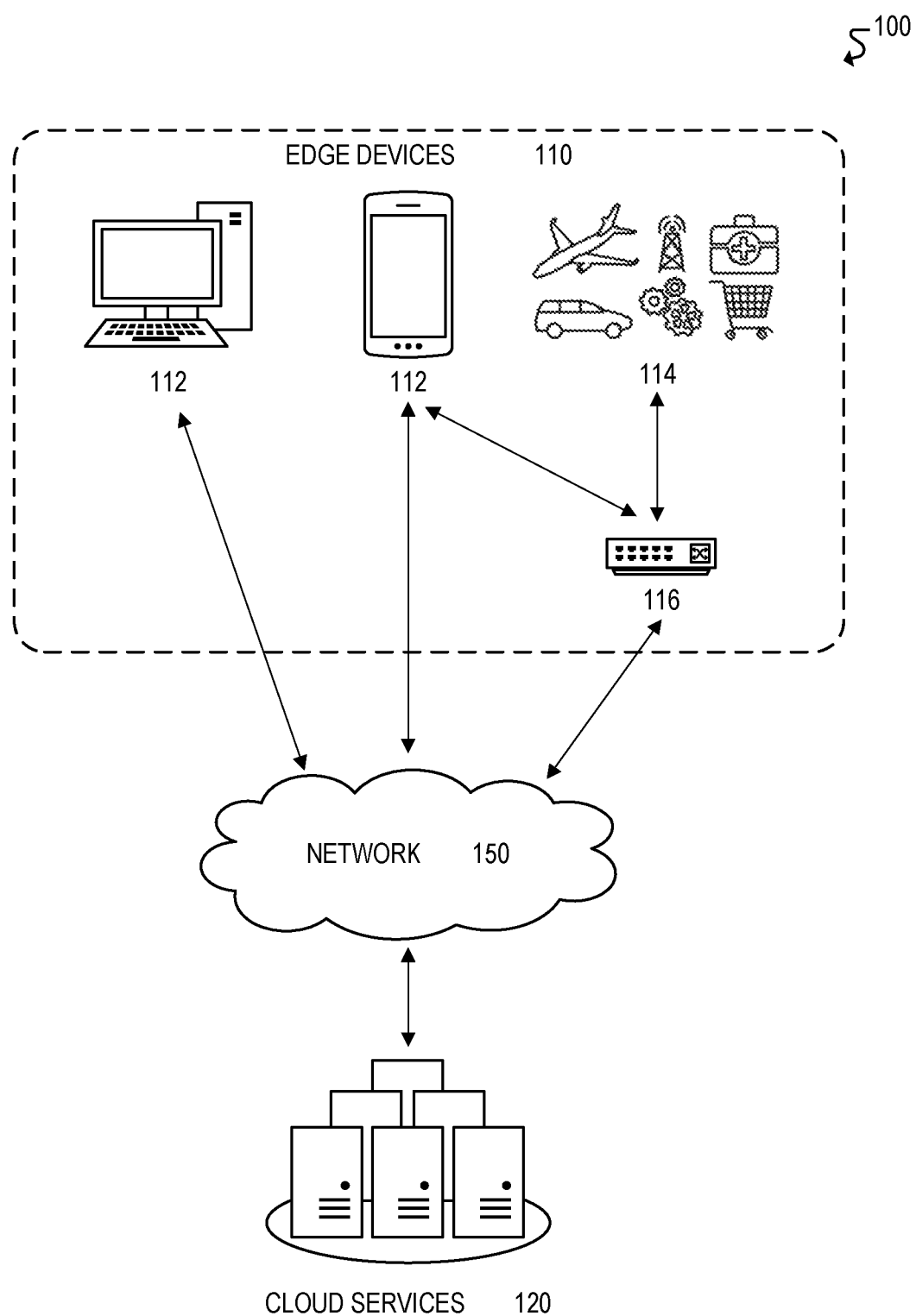
FIG. 1 illustrates a schematic diagram of an example computing system in accordance with certain embodiments.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Data analytics has a wide range of applications in computing systems, from data mining to machine learning and artificial intelligence, and has become an increasingly important aspect of large-scale computing applications. Data preprocessing, an important initial step in data analytics, involves transforming raw data into a suitable format for further processing and analysis. For example, real-world or raw data is often incomplete, inconsistent, and/or error prone. Accordingly, raw data may go through a series of preprocessing steps, such as data cleaning, integration, transformation, reduction, and/or discretization or quantization. Data discretization, for example, may involve converting or partitioning a range of continuous raw data into a smaller number of intervals or values. For example, data binning is a form of data discretization that involves grouping a collection of continuous values into a smaller number of "bins" that each represent a particular interval or range. The original data values may each be grouped into a defined interval or bin, and thus may be replaced by a value representative of that interval or bin, such as a center or boundary value of the interval. As an example, a collection of data identifying the age of a group of people may be binned into a smaller number of age intervals. In this manner, the raw data values are aggregated and the size of the dataset is reduced, and the resulting binned dataset may then be used for further analysis and processing, such as for data mining or machine learning and artificial intelligence (e.g., computer vision, autonomous navigation, computer or processor optimizations, speech and audio recognition, natural language processing). A histogram is an example of data binning that may be used for analyzing the underlying data distribution of the raw data. A histogram, for example, may be a representation of a data distribution that provides an estimate of the probability distribution of a continuous variable. A histogram may be represented in various forms, such as a data structure and/or a graphical representation. Moreover, a histogram may be constructed, for example, by "binning" a range of values into a series of smaller intervals, and then counting the number of values in each bin or interval. Histograms are powerful tools for categorizing or discretizing real-world data for further processing and analysis.

A significant challenge of data discretizing and binning is selecting the optimal bin size, such as a bin size that is sufficiently large but also preserves the original data distribution. For example, a binned dataset or histogram should provide meaningful binning of data into fewer categories for efficient data correlation and association (e.g., as required for many data mining and/or machine learning techniques), while also accurately representing the original data distribution. For advanced data processing techniques (e.g., clustering and pattern matching for data mining and/or machine learning purposes), it may be ideal for raw data to be binned into fewer bins with a larger bin size, as that may result in the raw data being summarized into meaningful segments, which may be particularly beneficial for datasets that span a large range of data and/or contain a large volume of data samples. On the other hand, however, decreasing the number of bins, and thus increasing the bin size, may cause the histogram or binned dataset to deviate from the inherent data distribution of the original raw dataset. Thus, the bin size should not be so small that the histogram loses its purpose, but should not be so large that the histogram significantly deviates from the original data distribution. Accordingly, determining the optimal bin size or bin width for performing data discretization and binning may be challenging.

Many approaches to selecting a bin size for data discretization and binning suffer from various drawbacks. For example, the bin size could be determined arbitrarily, but an arbitrary bin size may fail to provide a meaningful summarization of data and/or may fail to preserve the original data distribution, thus reducing overall performance. As another example, the bin size could be determined manually, but a manual approach can be a tedious and daunting task and may be prone to error. As another example, the bin size could be determined using certain formulas, such as the Freedman-Diaconis formula. However, those formulas often result in bin sizes that are too small to provide a meaningful summarization of data, and thus are not very useful for practical purposes, particularly when the dataset covers a large range of data and when developing a meaningful histogram is crucial to the success of the subsequent data processing methods (e.g., data mining and machine learning).

Accordingly, this disclosure describes various embodiments for selecting an optimal bin size for data discretization and binning. The described embodiments can be used to identify a bin size that provides a meaningful categorization or summarization of raw data without significantly deviating from the original data distribution. For example, the optimal bin size may be large enough to provide a meaningful summarization of the raw data, but small enough to preserve the original data distribution. In this manner, the described embodiments provide an optimal balance between these competing factors. Moreover, the described embodiments can be used to automatically discretize or bin data in a manner that is optimal for subsequent processing and analysis. Accordingly, the described embodiments can be used to improve the performance of large-scale applications or solutions (e.g., Internet-of-Things (IoT) applications) that depend on advanced data processing techniques, such as data mining, cognitive learning, machine learning, associative memory techniques, and artificial intelligence (e.g., using artificial neural networks), among other examples. Moreover, by automating the data discretization and binning process, the described embodiments reduce the analytics development time and the time-to-market for analytics applications. Finally, because the described embodiments are also computationally efficient, they are optimal even for resource-constrained devices (e.g., edge devices).

The described embodiments are particularly beneficial for use cases where developing a meaningful histogram is crucial to the success of the subsequent data processing methods, such as data mining or machine learning and artificial intelligence (e.g., computer vision, autonomous navigation, computer or processor optimizations, associative memory, speech and audio recognition, natural language processing). As an example, the described embodiments can be utilized with associative memory techniques that track co-occurrences of data values or data elements in order to identify associations and relationships between them.

Example embodiments that may be used to implement the features and functionality of this disclosure will now be described with more particular reference to the attached FIGURES.

FIG. 1 illustrates a schematic diagram of an example computing system 100. In various embodiments, system 100 and/or its underlying components may include functionality described throughout this disclosure for performing data discretization and binning using an optimal bin size. For example, data discretization functionality may be used in system 100 for a wide range of applications and/or use cases, from data mining to machine learning and artificial intelligence, among other examples. Moreover, data discretization functionality may be implemented by any component of system 100, such as edge devices 110, cloud services 120, and communications network 150. These various components of system 100, for example, could be implemented with data discretization functionality using optimal bin sizes, as described further throughout this disclosure in connection with the remaining FIGURES.

The various components in the illustrated example of computing system 100 will now be discussed further below.

Edge devices 110 may include any equipment and/or devices deployed or connected near the "edge" of a communication system 100. In the illustrated embodiment, edge devices 110 include end-user devices 112 (e.g., desktops, laptops, mobile devices), Internet-of-Things (IoT) devices 114, and gateways and/or routers 116, among other examples. Edge devices 110 may communicate with each other and/or with other remote networks and services (e.g., cloud services 120) through one or more networks and/or communication protocols, such as communication network 150. Moreover, in some embodiments, certain edge devices 110 may include the data discretization functionality described throughout this disclosure.

End-user devices 112 may include any device that enables or facilitates user interaction with computing system 100, including, for example, desktop computers, laptops, tablets, mobile phones and other mobile devices, and wearable devices (e.g., smart watches, smart glasses, headsets), among other examples.

IoT devices 114 may include any device capable of communicating and/or participating in an Internet-of-Things (IoT) system or network. IoT systems may refer to new or improved ad-hoc systems and networks composed of multiple different devices (e.g., IoT devices 114) interoperating and synergizing for a particular application or use case. Such ad-hoc systems are emerging as more and more products and equipment evolve to become "smart," meaning they are controlled or monitored by computer processors and are capable of communicating with other devices. For example, an IoT device 114 may include a computer processor and/or communication interface to allow interoperation with other components of system 100, such as with cloud services 120 and/or other edge devices 110. IoT devices 114 may be "greenfield" devices that are developed with IoT capabilities from the ground-up, or "brownfield" devices that are created by integrating IoT capabilities into existing legacy devices that were initially developed without IoT capabilities. For example, in some cases, IoT devices 114 may be built from sensors and communication modules integrated in or attached to "things," such as equipment, toys, tools, vehicles, living things (e.g., plants, animals, humans), and so forth. Alternatively, or additionally, certain IoT devices 114 may rely on intermediary components, such as edge gateways or routers 116, to communicate with the various components of system 100.

IoT devices 114 may include various types of sensors for monitoring, detecting, measuring, and generating sensor data and signals associated with characteristics of their environment. For instance, a given sensor may be configured to detect one or more respective characteristics, such as movement, weight, physical contact, biometric properties, temperature, wind, noise, light, position, humidity, radiation, liquid, specific chemical compounds, battery life, wireless signals, computer communications, and bandwidth, among other examples. Sensors can include physical sensors (e.g., physical monitoring components) and virtual sensors (e.g., software-based monitoring components). IoT devices 114 may also include actuators to perform various actions in their respective environments. For example, an actuator may be used to selectively activate certain functionality, such as toggling the power or operation of a security system (e.g., alarm, camera, locks) or household appliance (e.g., audio system, lighting, HVAC appliances, garage doors), among other examples.

Indeed, this disclosure contemplates use of a potentially limitless universe of IoT devices 114 and associated sensors/actuators. IoT devices 114 may include, for example, any type of equipment and/or devices associated with any type of system 100 and/or industry, including transportation (e.g., automobile, airlines), industrial manufacturing, energy (e.g., power plants), telecommunications (e.g., Internet, cellular, and television service providers), medical (e.g., healthcare, pharmaceutical), food processing, and/or retail industries, among others. In the transportation industry, for example, IoT devices 114 may include equipment and devices associated with aircrafts, automobiles, or vessels, such as navigation systems, autonomous flight or driving systems, traffic sensors and controllers, and/or any internal mechanical or electrical components that are monitored by sensors (e.g., engines). IoT devices 114 may also include equipment, devices, and/or infrastructure associated with industrial manufacturing and production, shipping (e.g., cargo tracking), communications networks (e.g., gateways, routers, servers, cellular towers), server farms, electrical power plants, wind farms, oil and gas pipelines, water treatment and distribution, wastewater collection and treatment, and weather monitoring (e.g., temperature, wind, and humidity sensors), among other examples. IoT devices 114 may also include, for example, any type of "smart" device or system, such as smart entertainment systems (e.g., televisions, audio systems, videogame systems), smart household or office appliances (e.g., heat-ventilation-air-conditioning (HVAC) appliances, refrigerators, washers and dryers, coffee brewers), power control systems (e.g., automatic electricity, light, and HVAC controls), security systems (e.g., alarms, locks, cameras, motion detectors, fingerprint scanners, facial recognition systems), and other home automation systems, among other examples. IoT devices 114 can be statically located, such as mounted on a building, wall, floor, ground, lamppost, sign, water tower, or any other fixed or static structure. IoT devices 114 can also be mobile, such as devices in vehicles or aircrafts, drones, packages (e.g., for tracking cargo), mobile devices, and wearable devices, among other examples. Moreover, an IoT device 114 can also be any type of edge device 110, including end-user devices 112 and edge gateways and routers 116.

Edge gateways and/or routers 116 may be used to facilitate communication to and from edge devices 110. For example, gateways 116 may provide communication capabilities to existing legacy devices that were initially developed without any such capabilities (e.g., "brownfield" IoT devices). Gateways 116 can also be utilized to extend the geographical reach of edge devices 110 with short-range, proprietary, or otherwise limited communication capabilities, such as IoT devices 114 with Bluetooth or ZigBee communication capabilities. For example, gateways 116 can serve as intermediaries between IoT devices 114 and remote networks or services, by providing a front-haul to the IoT devices 114 using their native communication capabilities (e.g., Bluetooth, ZigBee), and providing a back-haul to other networks 150 and/or cloud services 120 using another wired or wireless communication medium (e.g., Ethernet, Wi-Fi, cellular). In some embodiments, a gateway 116 may be implemented by a dedicated gateway device, or by a general purpose device, such as another IoT device 114, end-user device 112, or other type of edge device 110.

In some instances, gateways 116 may also implement certain network management and/or application functionality (e.g., IoT management and/or IoT application functionality for IoT devices 114), either separately or in conjunction with other components, such as cloud services 120 and/or other edge devices 110. For example, in some embodiments, configuration parameters and/or application logic may be pushed or pulled to or from a gateway device 116, allowing IoT devices 114 (or other edge devices 110) within range or proximity of the gateway 116 to be configured for a particular IoT application or use case.

Cloud services 120 may include services that are hosted remotely over a network 150, or in the "cloud." In some embodiments, for example, cloud services 120 may be remotely hosted on servers in datacenter (e.g., application servers or database servers). Cloud services 120 may include any services that can be utilized by or for edge devices 110, including but not limited to, data storage, computational services (e.g., data analytics, searching, diagnostics and fault management), security services (e.g., surveillance, alarms, user authentication), mapping and navigation, geolocation services, network or infrastructure management, IoT application and management services, payment processing, audio and video streaming, messaging, social networking, news, and weather, among other examples. Moreover, in some embodiments, certain cloud services 120 may include the data discretization functionality described throughout this disclosure.

Network 150 may be used to facilitate communication between the components of computing system 100. For example, edge devices 110, such as end-user devices 112 and IoT devices 114, may use network 150 to communicate with each other and/or access one or more remote cloud services 120. Network 150 may include any number or type of communication networks, including, for example, local area networks, wide area networks, public networks, the Internet, cellular networks, Wi-Fi networks, short-range networks (e.g., Bluetooth or ZigBee), and/or any other wired or wireless networks or communication mediums.

Any, all, or some of the computing devices of system 100 may be adapted to execute any operating system, including Linux or other UNIX-based operating systems, Microsoft Windows, Windows Server, MacOS, Apple iOS, Google Android, or any customized and/or proprietary operating system, along with virtual machines adapted to virtualize execution of a particular operating system.

While FIG. 1 is described as containing or being associated with a plurality of elements, not all elements illustrated within system 100 of FIG. 1 may be utilized in each alternative implementation of the present disclosure. Additionally, one or more of the elements described in connection with the examples of FIG. 1 may be located external to system 100, while in other instances, certain elements may be included within or as a portion of one or more of the other described elements, as well as other elements not described in the illustrated implementation. Further, certain elements illustrated in FIG. 1 may be combined with other components, as well as used for alternative or additional purposes in addition to those purposes described herein.

Data Discretization

Figure 2:
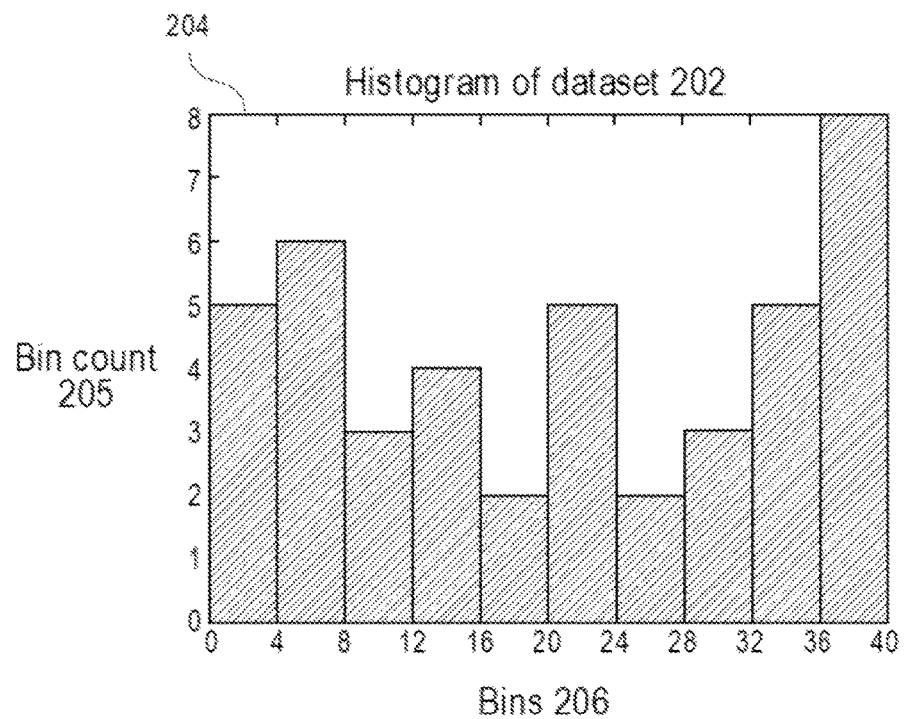
FIG. 2 illustrates an example of data discretization.

FIG. 2 illustrates an example 200 of data discretization. In the illustrated example, a histogram 204 is created for a dataset 202 by performing data discretization using an arbitrary bin size of 4. Dataset 202 is an array of example numerical data, which contains 43 total data elements with values ranging between 0 and 40. Using an arbitrary bin size or bin width of 4, the entire range of values of dataset 202 (from 0 to 40) is broken down into intervals of 4, and each interval is represented by a separate bin, resulting in a total of 10 bins. The data elements of dataset 202 are then grouped into the appropriate bin, and the number of data elements in each bin are counted. A histogram 204 is then used to represent the number of data elements in each bin. In the illustrated example, the y-axis of histogram 204 represents the bin count 205 (e.g., the number of data elements in a bin), and the x-axis represents the various bins 206. For example, bin 12 has a bin count of 3, which means there are 3 data elements in dataset 202 that are greater than 8 and less than or equal to 12 (e.g., data values 9, 10, and 12 in dataset 204).

The resulting histogram 204 represents an approximation of the data distribution of dataset 202. The granularity or precision of the approximated data distribution of a histogram is based on the bin size. While smaller bin sizes may result in a more precise representation of the original data distribution, larger bin sizes may result in fewer bins or categories which may be more efficient for subsequent analysis and processing. Thus, although an arbitrary bin size of 4 was used in the illustrated example, the optimal bin size for a given dataset may vary. Accordingly, it may be beneficial to determine an optimal bin size for a given dataset to ensure that the discretized data provides a useful summary of the dataset without significantly deviating from the original data distribution. In some embodiments, for example, an optimal bin size can be determined using the cost function described throughout this disclosure in connection with the remaining FIGURES.

Figure 3:
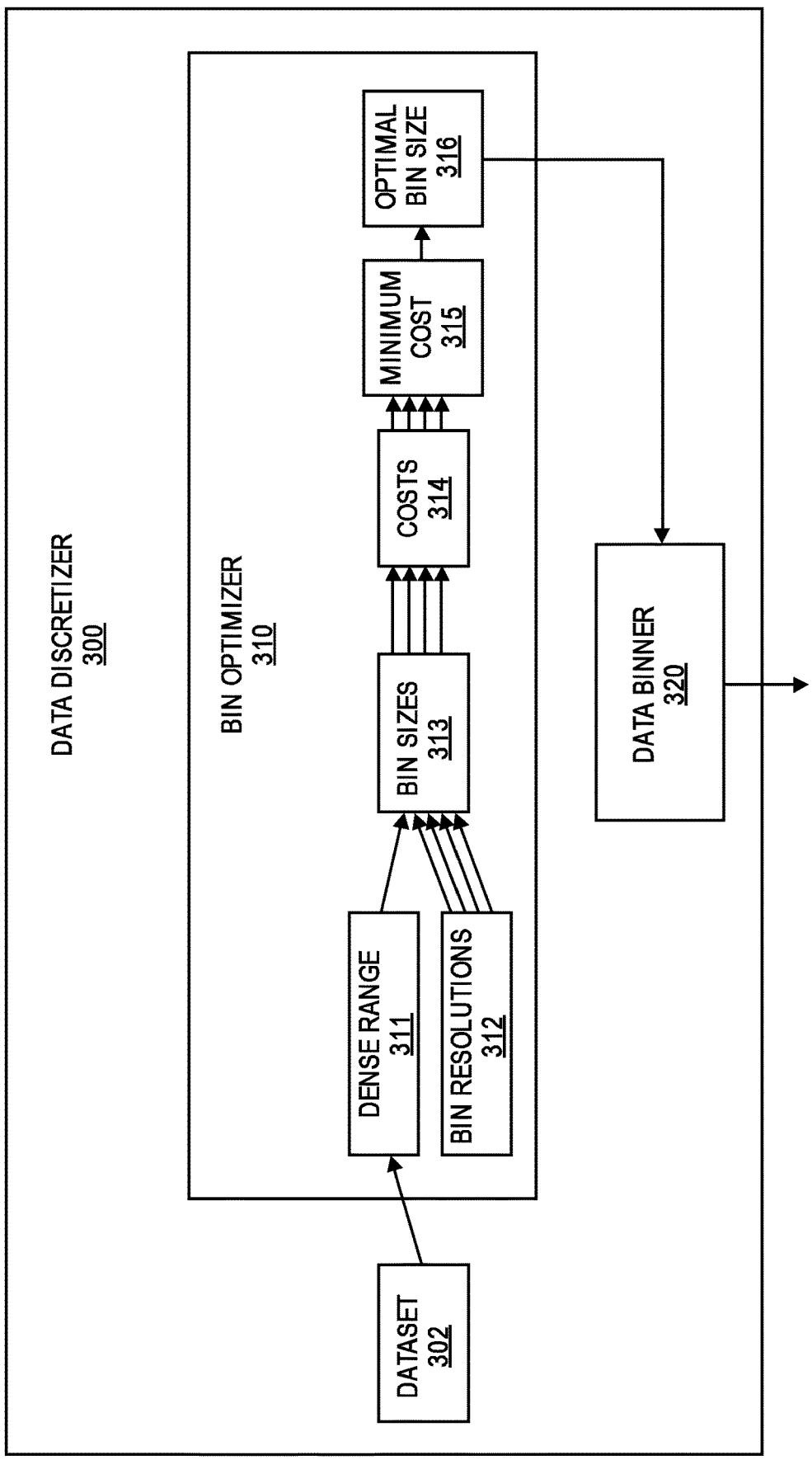
FIG. 3 illustrates a block diagram for an example embodiment of optimized data discretization.

FIG. 3 illustrates a block diagram for an example embodiment of optimized data discretization. The illustrated embodiment includes a data discretizer 300 for automatically performing data discretization on a particular dataset using an optimal bin size. For example, data discretizer 300 may determine an optimal bin size that ensures the discretized data provides a meaningful summary of the dataset without significantly deviating from the original data distribution. For example, the optimal bin size may be large enough to provide a meaningful summarization of the dataset, but small enough to preserve the original data distribution. In various embodiments, functionality of data discretizer 300 may be implemented using any type or combination of hardware and/or software logic, such as a processor (e.g., a microprocessor), application specific integrated circuit (ASIC), field programmable gate array (FPGA), or another type of integrated circuit or computing device or data processing device, and/or any associated software logic, instructions, or code.

In the illustrated embodiment, data discretizer 300 determines the optimal bin size using a cost function to minimize the difference in data distribution (before and after discretization) while maximizing the bin size. The cost function C can be represented using the following equation:

$$\text{cost } C = \frac{\max(\text{differences between adjacent bin counts})}{\text{bin size}}$$

In the above cost function C, "bin counts" refers to the number of data elements that fall into each discretized bin for a particular bin size, and the "differences between adjacent bin counts" refers to the difference in bin count between each pair of adjacent bins. In some embodiments, for example, the differences between adjacent bin counts may be determined by subtracting the $n^{th}$ bin count from the $(n-1)^{th}$ bin count. Accordingly, the cost C for a particular bin size may be calculated by identifying the maximum value of the differences between adjacent bin counts, and dividing that by the particular bin size. The optimal bin size for a particular dataset is the bin size with the smallest cost value C. Accordingly, the optimal bin size can be determined by solving for the particular bin size that minimizes the value of cost function C, for example, over a particular range of bin sizes.

Minimizing the cost function C in this manner effectively minimizes the maximum difference between adjacent bin counts (since that value is in the numerator), while simultaneously favoring larger bin sizes (since the bin size is in the denominator). This ensures that the resulting histogram provides the optimal balance between preserving the original data distribution while maximizing the bin size.

In the illustrated embodiment, data discretizer 300 includes a bin optimizer 310 that can be used to identify the optimal bin size for binning dataset 302. Bin optimizer 310 first identifies a dense range 311 of the dataset 302. In some embodiments, for example, the mean and standard deviation of the dataset 302 may be computed, and then dense range 311 may be identified as a range that is within a particular number of standard deviations from the mean. For example, in some embodiments (e.g., for datasets with Gaussian distributions), the dense range 311 may be +−2 standard deviations from the mean. Accordingly, identifying the dense data range in this manner ensures that outliers or data with long tails do not impact the optimal bin size.

Next, bin optimizer 310 identifies a range of potential bin resolutions 312 for the optimal bin size. In some embodiments, for example, the range of bin resolutions 312 may be identified based on configurable parameters, such as a start resolution, stop resolution, and step. For example, if the start resolution, stop resolution, and step are respectively set using default values of 0.1, 0.2, and 0.001, the resulting bin sizes will range from 10% to 20% of the size of the dense range 311, and in increments of 0.1%. In this manner, the range of potential bin resolutions 312 are used to calculate a range of corresponding bin sizes 313, for example, by multiplying each bin resolution 312 by the size of the dense range 311.

A cost value 314 may then be computed for each bin size 313. For example, for a particular bin size, first the boundaries or center values of the bins may be computed. The bin boundaries for a particular bin size 313 may be computed, for example, by enumerating the dense data range 311 from lowest end to highest end using a step or interval equal to the particular bin size 313. A histogram can then be created for the particular bin size 313, for example, by counting the number of data elements of dataset 302 that fall into each bin. The histogram can then be used to compute the differences in bin count for adjacent bins. For example, for each bin other than the $1^{st}$ bin, the bin count of the particular bin may be subtracted from the bin count of the preceding bin, and the absolute value of the result may be returned as the difference between those respective bin counts. The maximum value of these differences in adjacent bin count can then be identified. The cost value 314 for the particular bin size 313 can then be computed, for example, using the cost function C identified above (e.g., by dividing the maximum difference in adjacent bin counts by the particular bin size). This process can be repeated in order to compute cost values 314 for all potential bin sizes 313.

The cost values 314 of the respective bin sizes 313 are then used to identify the minimum cost value 315, and the optimal bin size 316 is then identified as the bin size associated with the minimum cost value 315.

The optimal bin size 316 can then used by data binner 320, for example, to perform binning on dataset 302 and/or generate a histogram. For example, the optimal bin size can be used to determine the total number of bins and the interval or range of each bin, and dataset 302 can then be partitioned into the respective bins. The total number of bins, for example, can be computed by dividing the size of the dense data range 311 by the optimal bin size 316 and rounding up the result.

Example pseudocode for implementing the functionality of data discretizer 300 is provided below:

```
// Step 1: Identify dense range of dataset
    mean = mean(dataset); // Compute mean of dataset
    std_dev = std_dev(dataset); // Compute standard deviation of dataset
    dense_range = mean +- 2*std_dev;  // Compute dense range as +-2
    standard deviations from the mean
// Step 2: Identify range of potential bin resolutions
    // Initialize the bin size resolutions array based on the configuration
    parameter values for start_resolution, step, and end_resolution.
    Default values of start_resolution, step, and end_resolution are
    0.1, 0.001, and 0.2, respectively.  These default values produce bin
    sizes ranging from 10% to 20% of the dense range, with increments
    of 0.1%.
    bin_resolution = start_resolution: step : end_resolution;
// Step 3: Calculate cost function (C) for each potential bin size
    for each element [i] in the bin_resolution array:
        // Create a binsize iterator to store the bin size computed using
        the resolution from the current iteration of the bin_resolution
        array
        binsize_iterator = size of dense_range * bin_resolution[i];
        // Save the computed bin size from the current iteration in an
        array computed_binsizes[i] = binsize_iterator;
        // Create an array of the bin boundary or center values
        bin_boundaries   = min(dense_range)   :
        binsize_iterator    : max(dense_range);
        // Create a histogram based on the bin boundaries
        [counts, bins] = hist(dataset, bin_boundaries);
        // Compute the absolute values of the differences between
        adjacent bin counts, and save them in the diffs_adj_bincount
        array
        diffs_adj_bincount = abs(differences between adjacent bin
        counts);
        // Find the maximum difference between adjacent bin counts,
        and save in the max_diff_adj_bincount array
        max_diff_adj_bincount[i] = max(diffs_adj_bincount);
        // Compute the Cost function for this bin size:
        cost[i] = max_diff_adj_bincount[i] / computed_binsizes[i];
// Step 4: Find the optimal bin size with the minimum cost
    [value, index] = min(cost);
    optimal_binsize = computed_binsizes[index];   // optimal_binsize
    is the optimal discretization bin size for the data
// Step 5: Compute the total number of bins
    optimal_number_of_bins = ceiling(dense_range /
    optimal_binsize);
```

Figure 4:
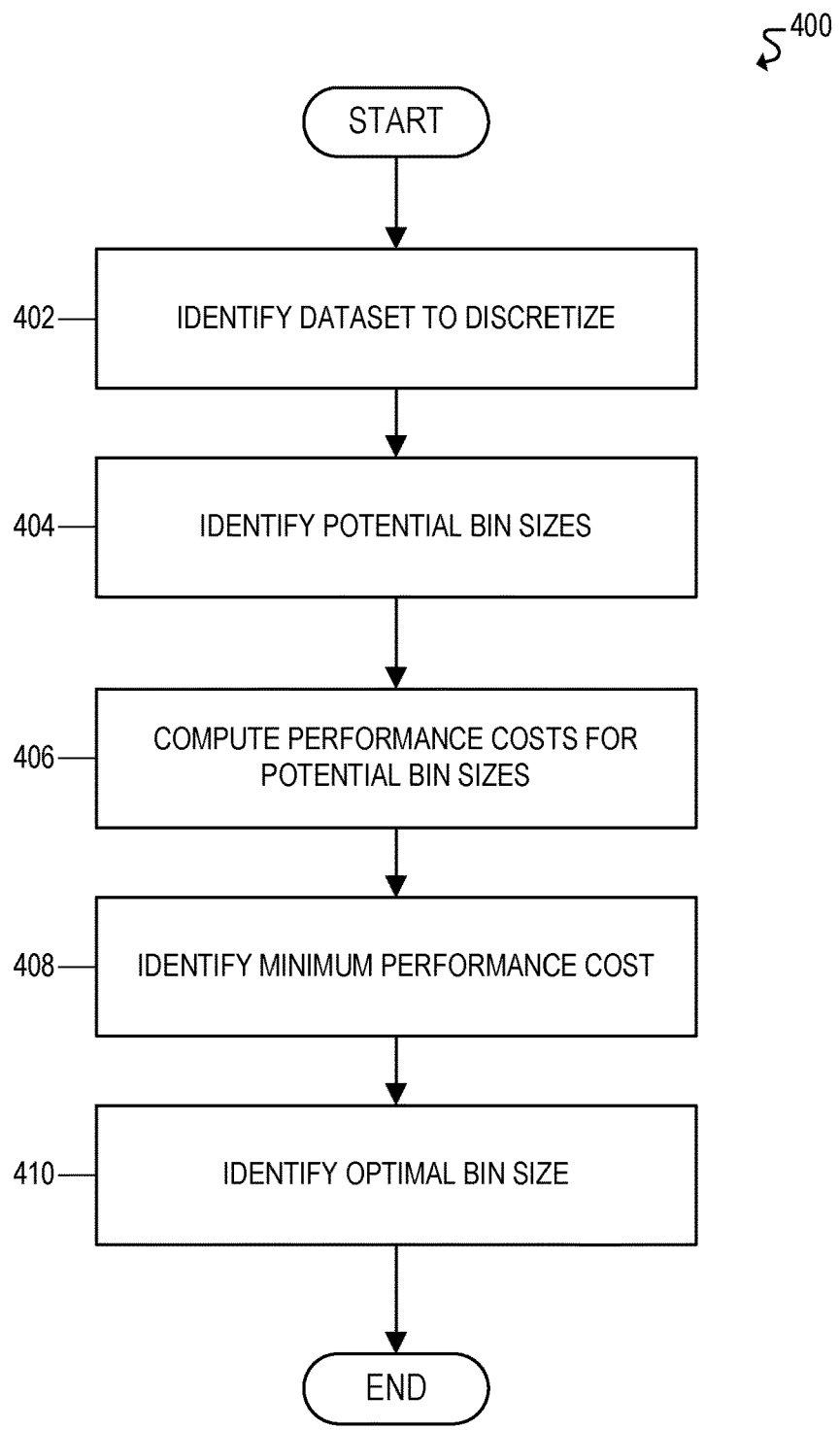
FIG. 4 illustrates a flowchart for an example embodiment of optimized data discretization.

FIG. 4 illustrates a flowchart 400 for an example embodiment of optimized data discretization. Flowchart 400 may be implemented, in some embodiments, using the embodiments and functionality described throughout this disclosure.

The flowchart may begin at block 402 by identifying a dataset for performing data discretization or data binning. The dataset, for example, may be identified based on a plurality of data values or data elements associated with, or provided by, a computing device. In some embodiments, for example, the data values may be provided, generated, and/or obtained by a sensor device (e.g., a sensor associated with an IoT device 114 of FIG. 1), or another type of data processing device.

Moreover, in some embodiments, the dataset may be identified based on a dense data range of a parent dataset. In some embodiments, for example, the mean and standard deviation of a parent dataset may be computed, and the dense data range may be identified as a range that is within a particular number of standard deviations from the mean. For example, in some embodiments (e.g., for datasets with Gaussian distributions), the dense range may be +−2 standard deviations from the mean.

The flowchart may then proceed to block 404 to identify potential bin sizes for binning the dataset. In some embodiments, for example, the potential bin sizes may be based on a range of bin resolutions that are each associated with a percentage of the size of the dataset range. In some embodiments, for example, the range of bin resolutions may be identified based on configurable parameters, such as a start resolution, stop resolution, and step. For example, if the start resolution, stop resolution, and step are respectively set using default values of 0.1, 0.2, and 0.001, the resulting bin sizes will range from 10% to 20% of the size of the data range, and in increments of 0.1%. In this manner, the range of potential bin resolutions are used to calculate a range of corresponding bin sizes, for example, by multiplying each bin resolution by the size of the data range.

The flowchart may then proceed to block 406 to compute a performance cost for each potential bin size. For example, for a particular bin size, first the boundaries or center values of the bins may be computed. The bin boundaries for a particular bin size may be computed, for example, by enumerating the data range of the dataset from lowest end to highest end using a step or interval equal to the particular bin size. A histogram can then be created for the particular bin size, for example, by counting the number of data elements of dataset that fall into each bin. The histogram can then be used to compute the differences in bin count for adjacent bins. For example, for each bin other than the $1^{st}$ bin, the bin count of the particular bin may be subtracted from the bin count of the preceding bin, and the absolute value of the result may be returned as the difference between those respective adjacent bin counts. The maximum value of these differences in adjacent bin counts can then be identified. The performance cost for the particular bin size can then be computed, for example, by dividing the maximum difference in adjacent bin counts by the particular bin size. This process can be repeated in order to compute performance costs for all potential bin sizes.

The flowchart may then proceed to block 408 to identify the minimum performance cost of the various performance costs for the potential bin sizes.

The flowchart may then proceed to block 410 to identify the optimal bin size. The optimal bin size may be identified, for example, as the bin size associated with the minimum performance cost. Accordingly, the optimal bin size is selected in a manner that maximizes the bin size while minimizing the difference in data distribution.

Moreover, in some embodiments, the optimal bin size may then be used to identify a binned dataset or histogram, for example, by partitioning or binning the original dataset based on the optimal bin size. The binned dataset or histogram may then be used for further processing and analysis, such as for machine learning, neural network, and/or data mining operations.

At this point, the flowchart may be complete. In some embodiments, however, the flowchart may restart and/or certain blocks may be repeated. For example, in some embodiments, the flowchart may restart at block 402 to continue performing data discretization on additional datasets.

Figure 5A:
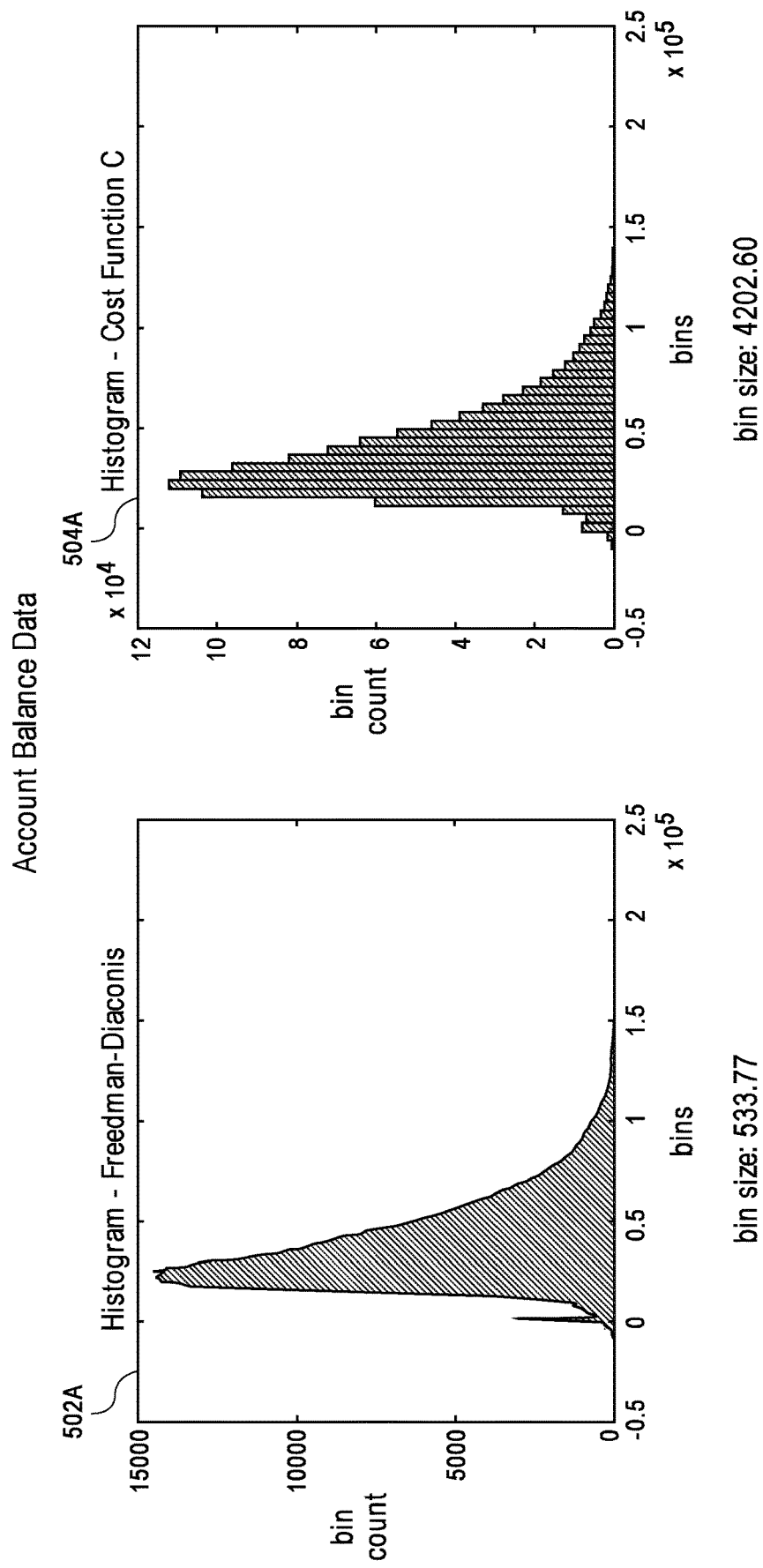
Figure 5B:
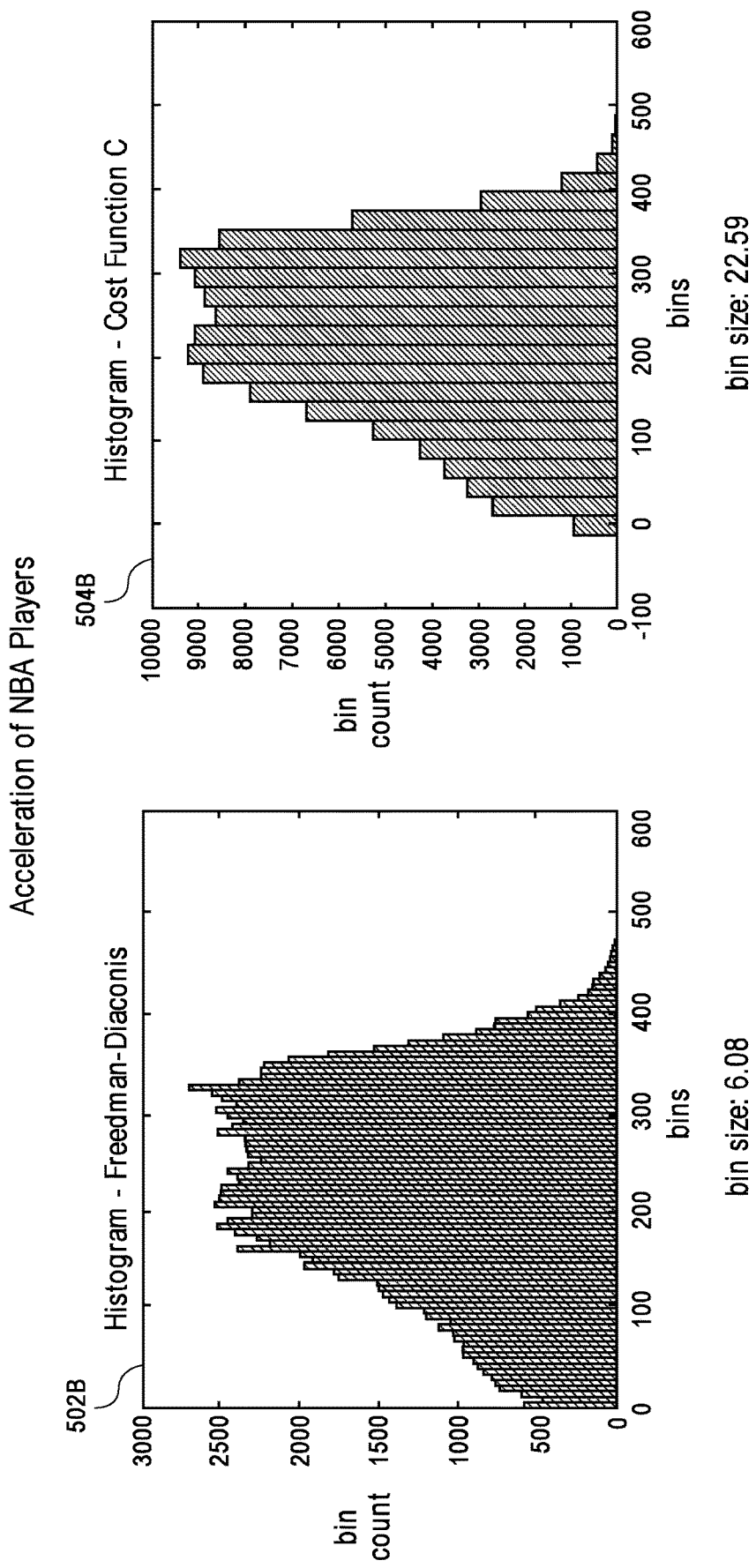
Figure 5C:
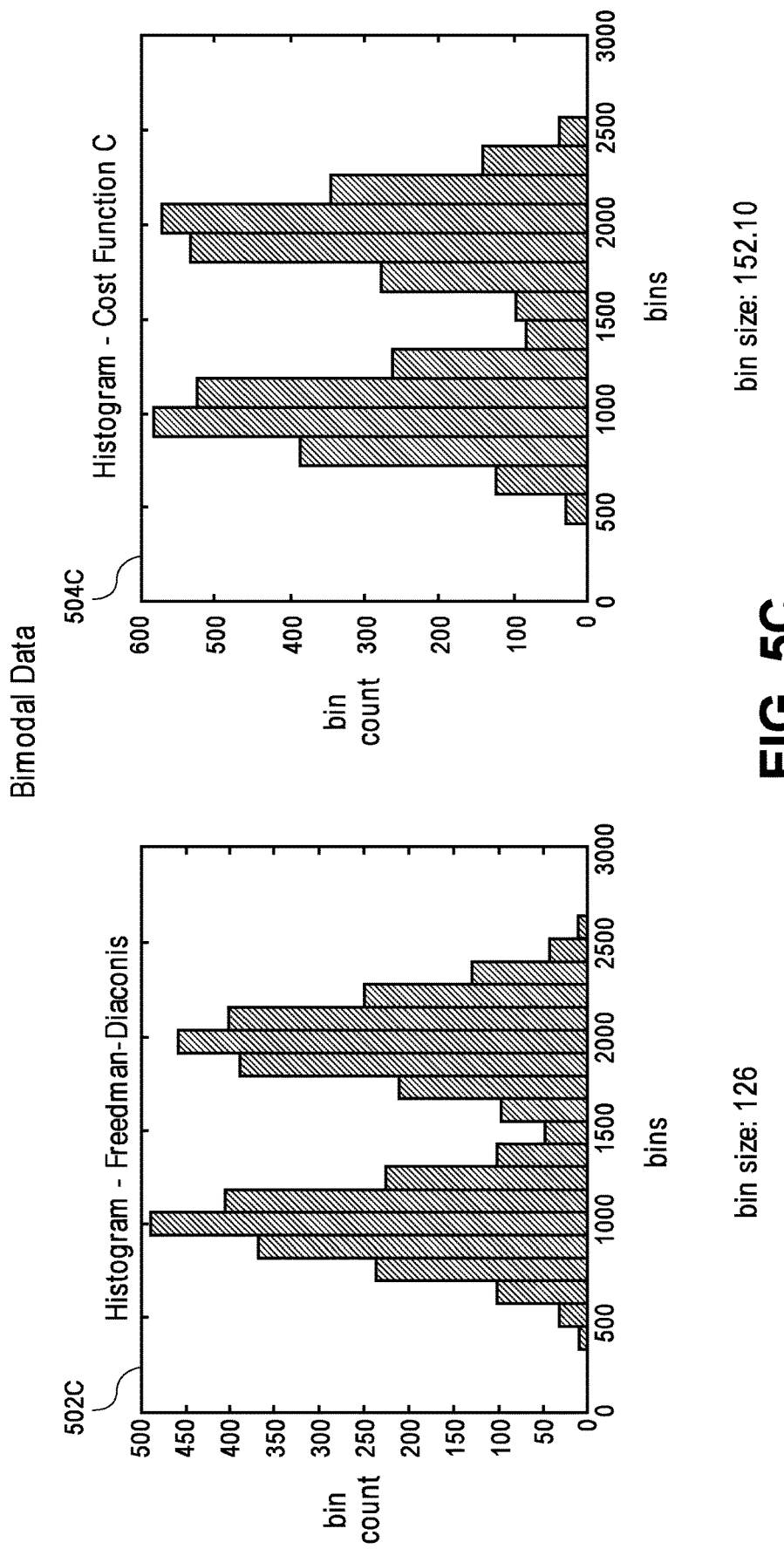
Figure 5E:
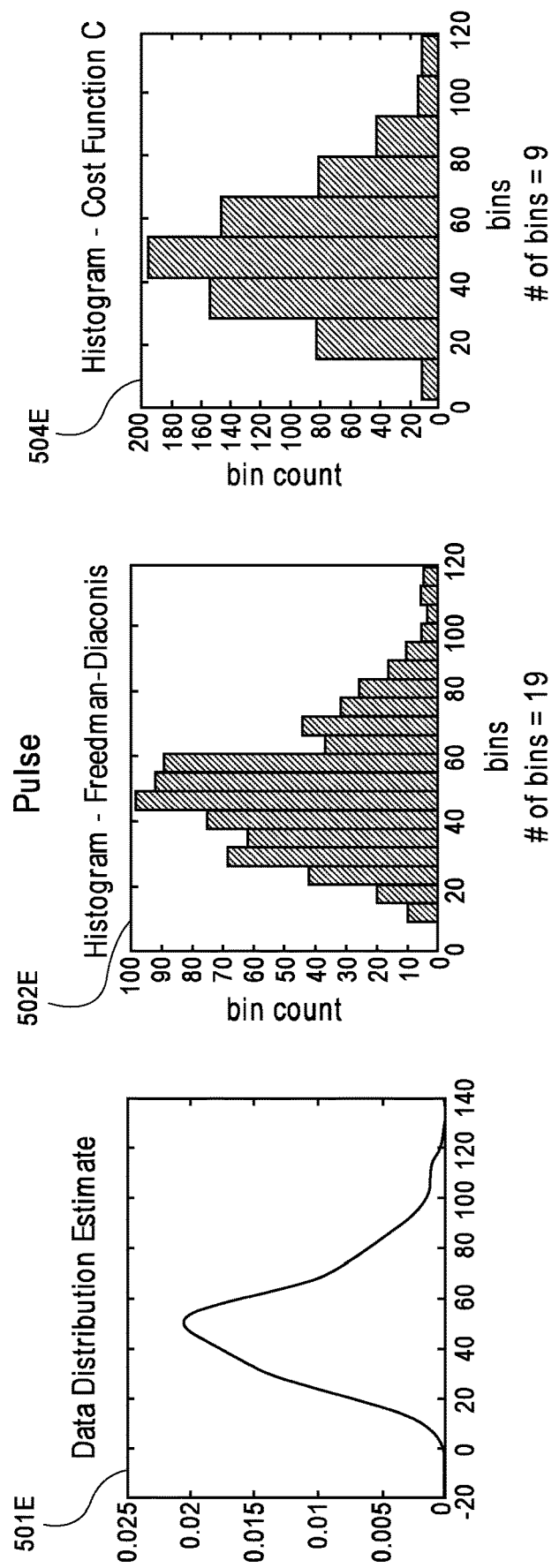

FIGS. 5A-E provide a comparison of various data discretization approaches in a variety of use cases. In particular, FIGS. 5A-E each represent a particular use case, and each use case compares histograms created by discretizing a particular dataset using the Freedman-Diaconis approach versus the cost function approach described throughout this disclosure. The use cases of FIGS. 5A-E respectively illustrate bank account balances (FIG. 5A), acceleration of NBA players (FIG. 5B), bimodal data (FIG. 5C), athlete time-to-peak-speed (FIG. 5D), and pulse (FIG. 5E).

In each example, the histogram created using the Freedman-Diaconis approach is identified by reference numeral 502 (e.g., 502A-E), and the histogram created using the cost function approach is identified by reference numeral 504 (e.g., 504A-E). Moreover, FIGS. 5A-C identify the bin size for each histogram, and FIGS. 5D-E identify the total number of bins for each histogram. FIGS. 5D-E also illustrate a data distribution estimate 501 (e.g., 501D-E) for comparison with the associated histograms.

As shown by these use cases, the bin sizes of the histograms are significantly larger—and similarly the total number of bins is significantly smaller—when using the cost function approach compared to the Freedman-Diaconis approach. In addition, the data distribution is still preserved when using the cost function approach. Accordingly, these use cases demonstrate that the cost function approach described throughout this disclosure provides the optimal balance between maximizing the bin size while minimizing the difference in data distribution.

Example Computing Architectures

Figure 6:
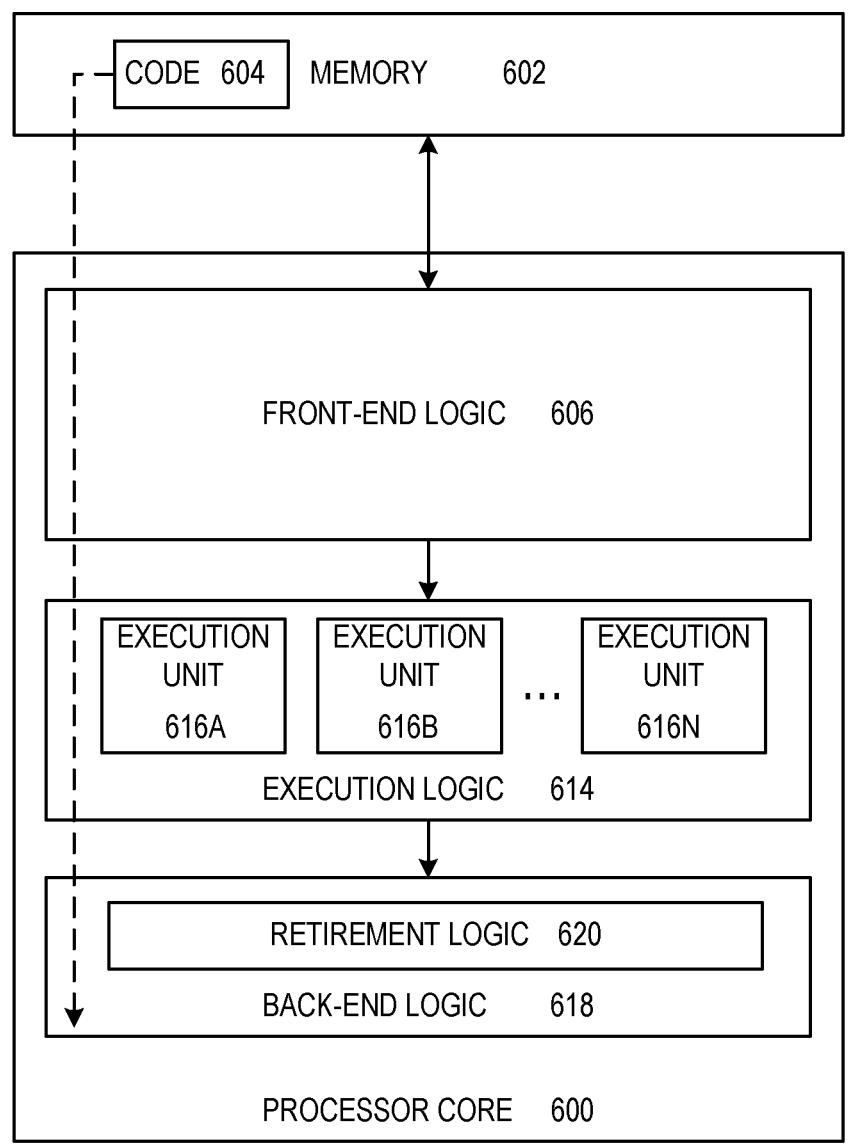
FIGS. 6 and 7 illustrate example computer architectures that can be used in accordance with embodiments disclosed herein.
Figure 7:
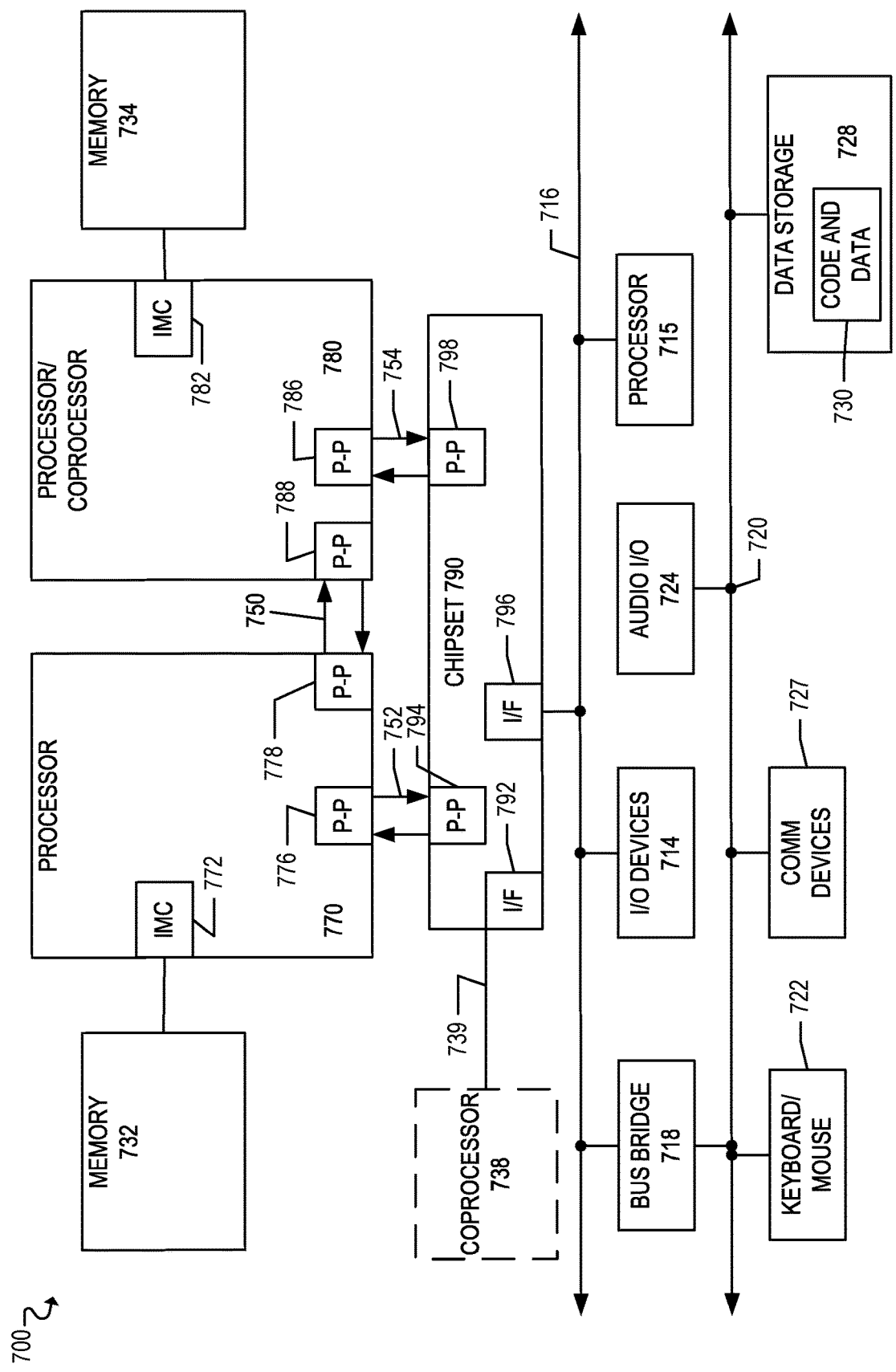

FIGS. 6 and 7 illustrate example computer processor architectures that can be used in accordance with embodiments disclosed herein. For example, in various embodiments, the computer architectures of FIGS. 6 and 7 may be used to implement the data discretization functionality described throughout this disclosure. Other embodiments may use other processor and system designs and configurations known in the art, for example, for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

FIG. 6 illustrates a block diagram for an example embodiment of a processor 600. Processor 600 is an example of a type of hardware device that can be used in connection with the embodiments described throughout this disclosure. Processor 600 may be any type of processor, such as a microprocessor, an embedded processor, a digital signal processor (DSP), a network processor, a multi-core processor, a single core processor, or other device to execute code. Although only one processor 600 is illustrated in FIG. 6, a processing element may alternatively include more than one of processor 600 illustrated in FIG. 6. Processor 600 may be a single-threaded core or, for at least one embodiment, the processor 600 may be multi-threaded in that it may include more than one hardware thread context (or "logical processor") per core.

FIG. 6 also illustrates a memory 602 coupled to processor 600 in accordance with an embodiment. Memory 602 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 600 can execute any type of instructions associated with algorithms, processes, or operations detailed herein. Generally, processor 600 can transform an element or an article (e.g., data) from one state or thing to another state or thing.

Code 604, which may be one or more instructions to be executed by processor 600, may be stored in memory 602, or may be stored in software, hardware, firmware, or any suitable combination thereof, or in any other internal or external component, device, element, or object where appropriate and based on particular needs. In one example, processor 600 can follow a program sequence of instructions indicated by code 604. Each instruction enters a front-end logic 606 and is processed by one or more decoders 608. The decoder may generate, as its output, a micro operation such as a fixed width micro operation in a predefined format, or may generate other instructions, microinstructions, or control signals that reflect the original code instruction. Front-end logic 606 may also include register renaming logic and scheduling logic, which generally allocate resources and queue the operation corresponding to the instruction for execution.

Processor 600 can also include execution logic 614 having a set of execution units 616a, 616b, 616n, etc. Some embodiments may include a number of execution units dedicated to specific functions or sets of functions. Other embodiments may include only one execution unit or one execution unit that can perform a particular function. Execution logic 614 performs the operations specified by code instructions.

After completion of execution of the operations specified by the code instructions, back-end logic 618 can retire the instructions of code 604. In one embodiment, processor 600 allows out of order execution but requires in order retirement of instructions. Retirement logic 620 may take a variety of known forms (e.g., re-order buffers or the like). In this manner, processor 600 is transformed during execution of code 604, at least in terms of the output generated by the decoder, hardware registers and tables utilized by register renaming logic 610, and any registers (not shown) modified by execution logic 614.

Although not shown in FIG. 6, a processing element may include other elements on a chip with processor 600. For example, a processing element may include memory control logic along with processor 600. The processing element may include I/O control logic and/or may include I/O control logic integrated with memory control logic. The processing element may also include one or more caches. In some embodiments, non-volatile memory (such as flash memory or fuses) may also be included on the chip with processor 600.

FIG. 7 illustrates a block diagram for an example embodiment of a multiprocessor 700. As shown in FIG. 7, multiprocessor system 700 is a point-to-point interconnect system, and includes a first processor 770 and a second processor 780 coupled via a point-to-point interconnect 750. In some embodiments, each of processors 770 and 780 may be some version of processor 600 of FIG. 6.

Processors 770 and 780 are shown including integrated memory controller (IMC) units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may optionally exchange information with the coprocessor 738 via a high-performance interface 739. In one embodiment, the coprocessor 738 is a special-purpose processor, such as, for example, a high-throughput MIC processor, a network or communication processor, compression engine, graphics processor, GPGPU, embedded processor, matrix processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of this disclosure is not so limited.

As shown in FIG. 7, various I/O devices 714 may be coupled to first bus 716, along with a bus bridge 718 which couples first bus 716 to a second bus 720. In one embodiment, one or more additional processor(s) 715, such as coprocessors, high-throughput MIC processors, GPGPU's, accelerators (such as, e.g., graphics accelerators or digital signal processing (DSP) units), matrix processors, field programmable gate arrays, or any other processor, are coupled to first bus 716. In one embodiment, second bus 720 may be a low pin count (LPC) bus. Various devices may be coupled to a second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to the second bus 720. Note that other architectures are possible. For example, instead of the point-to-point architecture of FIG. 7, a system may implement a multi-drop bus or other such architecture.

All or part of any component of FIG. 7 may be implemented as a separate or stand-alone component or chip, or may be integrated with other components or chips, such as a system-on-a-chip (SoC) that integrates various computer components into a single chip.

Embodiments of the mechanisms disclosed herein may be implemented in hardware, software, firmware, or a combination of such implementation approaches. Certain embodiments may be implemented as computer programs or program code executing on programmable systems comprising at least one processor, a storage system (including volatile and non-volatile memory and/or storage elements), at least one input device, and at least one output device.

Program code, such as code 730 illustrated in FIG. 7, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of this disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Figure 8:
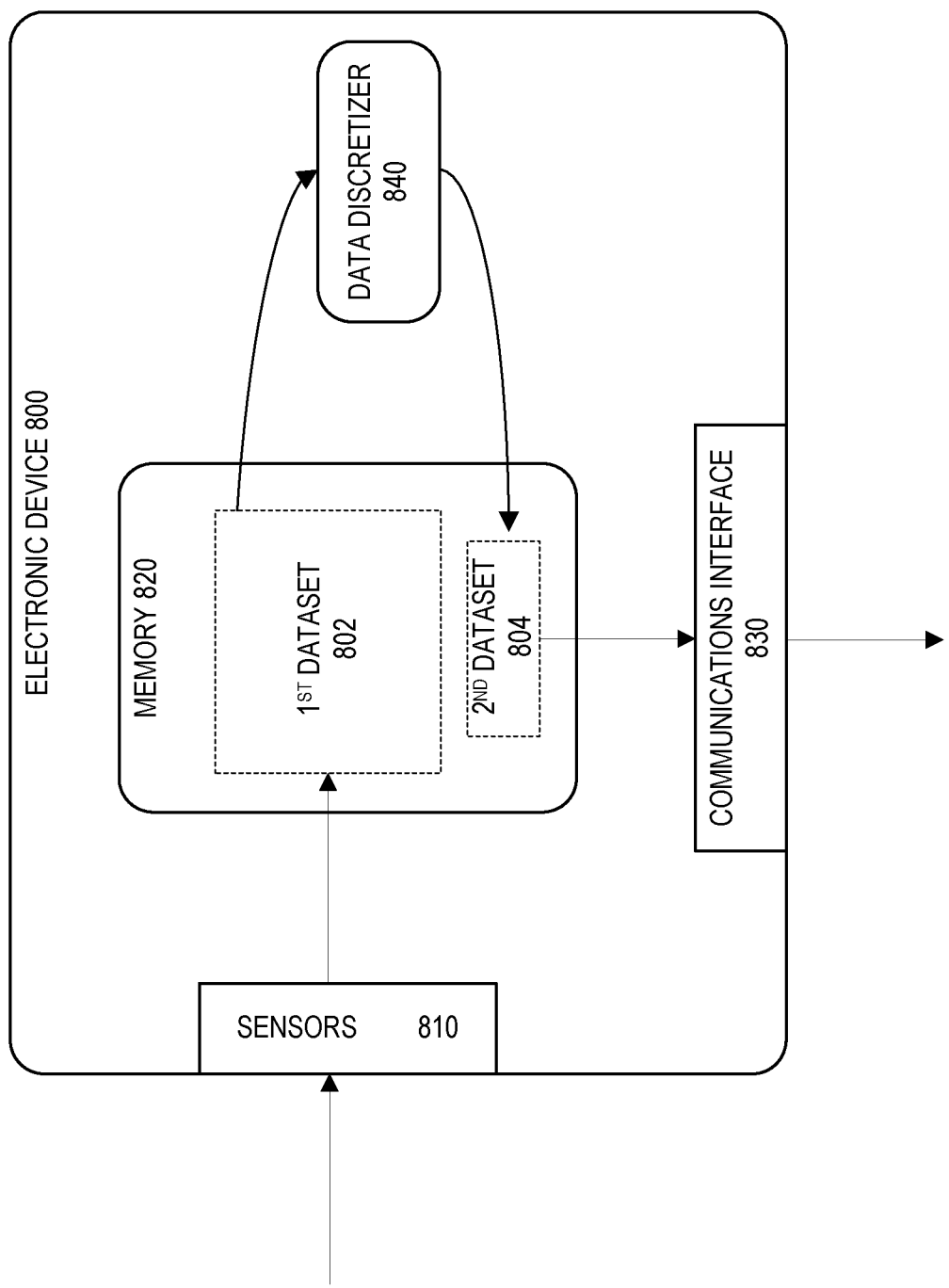
FIG. 8 illustrates an example embodiment of an electronic device with data discretization functionality.

FIG. 8 illustrates an example embodiment of an electronic device 800 with data discretization functionality. In the illustrated embodiment, electronic device 800 includes sensors 810, memory 820, communications interface 830, and data discretizer 840, as described further below.

Sensor(s) 810 may include any type of sensor for monitoring, detecting, measuring, and generating sensor data and signals associated with characteristics of their environment. For instance, a given sensor 810 may be configured to detect one or more respective characteristics, such as movement, weight, physical contact, biometric properties, temperature, wind, noise, light, position, humidity, radiation, liquid, specific chemical compounds, battery life, wireless signals, computer communications, and bandwidth, among other examples. Sensors 810 can include physical sensors (e.g., physical monitoring components) and virtual sensors (e.g., software-based monitoring components).

Memory 820 may include any type or combination of components capable of storing information, including volatile and/or non-volatile storage components, such as random access memory (RAM) (e.g., dynamic random access memory (DRAM), synchronous dynamic random access memory (SDRAM), static random access memory (SRAM)), dual in-line memory modules (DIMM), read only memory (ROM), logic blocks of a field programmable gate array (FPGA), erasable programmable read only memory (EPROM), electrically erasable programmable ROM (EE- PROM), flash or solid-state storage, non-volatile dual in-line memory modules (NVDIMM), storage class memory (SCM), direct access storage (DAS) memory, and/or any suitable combination of the foregoing.

Communications interface 830 may be an interface for communicating with any type of networks, devices, and/or components, including any wired or wireless interface, network, bus, line, or other transmission medium operable to carry signals and/or data. In some embodiments, for example, communications interface 830 may be an interface for communicating over one or more networks, such as local area networks, wide area networks, public networks, the Internet, cellular networks, Wi-Fi networks, short-range networks (e.g., Bluetooth or ZigBee), and/or any other wired or wireless networks or communication mediums.

Data discretizer 840 may be any component used for processing and/or discretizing datasets. In some embodiments, for example, functionality of data discretizer 840 may be implemented using any type or combination of hardware and/or software logic, such as a processor (e.g., a microprocessor), application specific integrated circuit (ASIC), field programmable gate array (FPGA), or another type of integrated circuit or computing device or data processing device, and/or any associated software logic, instructions, or code. In some embodiments, for example, data discretizer 840 may be similar to data discretizer 300 of FIG. 3.

In the illustrated example, a first dataset 802 is obtained initially. Dataset 802 may include any type of data used for any purpose, including data analytics (e.g., data mining, machine learning and artificial intelligence). In the illustrated embodiment, dataset 802 is obtained based on data generated by sensors 810. In other embodiments, however, dataset 802 can be obtained based on data provided by any source, including other devices, databases, users, networks, and so forth. For example, in some embodiments, dataset 802 may be obtained over a network (e.g., via communications interface 830).

In some embodiments, some or all of dataset 802 may initially be stored in memory 820. For example, in some cases, the entire dataset 802 may be stored in memory 820 (e.g., if sufficient memory capacity is available and/or dataset 802 is not excessive in size), while in other cases, only the portion of dataset 802 currently being processed may be stored in memory 820 (e.g., if memory capacity is limited and/or dataset 802 is excessive in size).

Dataset 802 may then be processed by data discretizer 840, for example, by performing data binning to reduce the size of the dataset. Data discretization or data binning, for example, may involve converting or partitioning a range of continuous raw data into a smaller number of "bins" that each represent a particular interval or range, and then maintaining only the bin counts, or the number of data elements in each bin. In this manner, the raw data values are aggregated and the size of the dataset is reduced or compressed. Accordingly, in the illustrated embodiment, data discretizer 840 performs data binning to reduce the size and/or compress the first dataset 802 into a second "binned" dataset 804. Moreover, in some embodiments, data discretizer 840 may determine an optimal bin size for performing the data binning, as described throughout this disclosure. For example, data discretizer 840 may identify an optimal bin size for generating a binned dataset 804 that provides a meaningful summary of the first dataset 802 without significantly deviating from the original data distribution of the first dataset 802. In this manner, the first dataset 802 is converted into a smaller compressed second dataset 804, or an efficiency vector, which can be stored and/or processed more efficiently and still maintains the important characteristics of the original dataset 802 (e.g., data distribution). Accordingly, the second dataset 804 removes a level of precision of the original dataset 802 that is both unnecessary and counterproductive to any subsequent processing and analysis.

The second binned dataset 804 may then be stored, transmitted, and/or used for further analysis and processing (e.g., or data mining or machine learning and artificial intelligence). For example, in some embodiments, the second dataset 804 may be stored in memory 820 using less memory space than would be required for the first dataset 802. The second dataset 804 may be transmitted over a network (e.g., via communications interface 830) using less transmission bandwidth than would be required for the first dataset 802. Moreover, the second dataset 804 can also be processed and/or analyzed more efficiently. In this manner, data binning can be used to increase memory availability for a device and/or reduce its memory requirements, preserve network bandwidth, and/or process data more efficiently.

The flowcharts and block diagrams in the FIGURES illustrate the architecture, functionality, and operation of possible implementations of systems, methods and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order or alternative orders, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The foregoing disclosure outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

All or part of any hardware element disclosed herein may readily be provided in a system-on-a-chip (SoC), including a central processing unit (CPU) package. An SoC represents an integrated circuit (IC) that integrates components of a computer or other electronic system into a single chip. The SoC may contain digital, analog, mixed-signal, and radio frequency functions, all of which may be provided on a single chip substrate. Other embodiments may include a multi-chip-module (MCM), with a plurality of chips located within a single electronic package and configured to interact closely with each other through the electronic package. In various other embodiments, the computing functionalities disclosed herein may be implemented in one or more silicon cores in Application Specific Integrated Circuits (ASICs), Field Programmable Gate Arrays (FPGAs), and other semiconductor chips.

As used throughout this specification, the term "processor" or "microprocessor" should be understood to include not only a traditional microprocessor (such as Intel's® industry-leading x86 and x64 architectures), but also graphics processors, matrix processors, and any ASIC, FPGA, microcontroller, digital signal processor (DSP), programmable logic device, programmable logic array (PLA), microcode, instruction set, emulated or virtual machine processor, or any similar "Turing-complete" device, combination of devices, or logic elements (hardware or software) that permit the execution of instructions.

Note also that in certain embodiments, some of the components may be omitted or consolidated. In a general sense, the arrangements depicted in the figures should be understood as logical divisions, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, and equipment options.

In a general sense, any suitably-configured processor can execute instructions associated with data or microcode to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, a storage may store information in any suitable type of tangible, non-transitory storage medium (for example, random access memory (RAM), read only memory (ROM), field programmable gate array (FPGA), erasable programmable read only memory (EPROM), electrically erasable programmable ROM (EEPROM), or microcode), software, hardware (for example, processor instructions or microcode), or in any other suitable component, device, element, or object where appropriate and based on particular needs. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein should be construed as being encompassed within the broad terms 'memory' and 'storage,' as appropriate. A non-transitory storage medium herein is expressly intended to include any non-transitory special-purpose or programmable hardware configured to provide the disclosed operations, or to cause a processor to perform the disclosed operations. A non-transitory storage medium also expressly includes a processor having stored thereon hardware-coded instructions, and optionally microcode instructions or sequences encoded in hardware, firmware, or software.

Computer program logic implementing all or part of the functionality described herein is embodied in various forms, including, but in no way limited to, hardware description language, a source code form, a computer executable form, machine instructions or microcode, programmable hardware, and various intermediate forms (for example, forms generated by an HDL processor, assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processor and memory can be suitably coupled to the board based on particular configuration needs, processing demands, and computing designs. Other components such as external storage, additional sensors, controllers for audio/video display, and peripheral devices may be attached to the board as plug-in cards, via cables, or integrated into the board itself. In another example, the electrical circuits of the FIGURES may be implemented as standalone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Example Implementations

The following examples pertain to embodiments described throughout this disclosure.

One or more embodiments may include an apparatus, comprising: a memory to store data; and a processor to: store a first dataset on the memory, wherein the first dataset comprises a plurality of data values; identify a plurality of bin sizes for compressing the first dataset into a second dataset; compute a plurality of performance costs associated with the plurality of bin sizes, wherein each performance cost of the plurality of performance costs is associated with a particular bin size of the plurality of bin sizes; identify a minimum performance cost of the plurality of performance costs; identify an optimal bin size based on the particular bin size associated with the minimum performance cost; partition the first dataset into a plurality of bins based on the optimal bin size; identify a plurality of bin counts associated with the plurality of bins; generate a second dataset based on the plurality of bin counts, wherein the second dataset is smaller than the first dataset; and store the second dataset on the memory, wherein the second dataset is stored using less memory space than the first dataset.

In one example embodiment of an apparatus, the processor to store the first dataset on the memory is further to: obtain the plurality of data values for the first dataset from one or more sensor devices; and store the plurality of data values for the first dataset on the memory.

In one example embodiment of an apparatus, the processor to compute the plurality of performance costs associated with the plurality of bin sizes is further to: generate a plurality of histograms associated with binning the first dataset based on the plurality of bin sizes; and compute the plurality of performance costs based on the plurality of histograms.

In one example embodiment of an apparatus, the processor to compute the plurality of performance costs associated with the plurality of bin sizes is further to: compute each performance cost of the plurality of performance costs by: identifying a second plurality of bins of the particular bin size; identifying a second plurality of bin counts associated with the second plurality of bins; identifying a maximum difference in bin count for adjacent bins of the second plurality of bins; and dividing the maximum difference in bin count by the particular bin size.

In one example embodiment of an apparatus, the processor to store the first dataset on the memory is further to: identify a dense data range of a parent dataset; and identify the first dataset based on the dense data range of the parent dataset.

In one example embodiment of an apparatus, the processor to identify the dense data range of the parent dataset is further to: compute a mean of the parent dataset; compute a standard deviation of the parent dataset; and identify the dense data range of the parent dataset based on the mean and the standard deviation.

In one example embodiment of an apparatus, the processor to identify the plurality of bin sizes for compressing the first dataset into the second dataset is further to identify a plurality of bin resolutions, wherein each bin resolution of the plurality of bin resolutions is associated with a percentage of a range size of the first dataset.

In one example embodiment of an apparatus, the processor is further to identify a relationship for an associative memory based on an analysis of the second dataset.

One or more embodiments may include at least one machine accessible storage medium having instructions stored thereon, wherein the instructions, when executed on a machine, cause the machine to: store a first dataset on a memory device, wherein the first dataset comprises a plurality of data values associated with a computing device; identify a plurality of bin sizes for compressing the first dataset into a second dataset; compute a plurality of performance costs associated with the plurality of bin sizes, wherein each performance cost of the plurality of performance costs is associated with a particular bin size of the plurality of bin sizes; identify a minimum performance cost of the plurality of performance costs; identify an optimal bin size based on the particular bin size associated with the minimum performance cost; partition the first dataset into a plurality of bins based on the optimal bin size; identify a plurality of bin counts associated with the plurality of bins; generate a second dataset based on the plurality of bin counts, wherein the second dataset is smaller than the first dataset; and store the second dataset on the memory device, wherein the second dataset is stored using less memory space than the first dataset.

In one example embodiment of a storage medium, the instructions that cause the machine to store the first dataset on the memory device further cause the machine to: obtain the plurality of data values for the first dataset from one or more sensor devices; and store the plurality of data values for the first dataset on the memory device.

In one example embodiment of a storage medium, the instructions that cause the machine to compute the plurality of performance costs associated with the plurality of bin sizes further cause the machine to: generate a plurality of histograms associated with binning the first dataset based on the plurality of bin sizes; and compute the plurality of performance costs based on the plurality of histograms.

In one example embodiment of a storage medium, the instructions that cause the machine to compute the plurality of performance costs associated with the plurality of bin sizes further cause the machine to: compute each performance cost of the plurality of performance costs by: identifying a second plurality of bins of the particular bin size; identifying a second plurality of bin counts associated with the second plurality of bins; identifying a maximum difference in bin count for adjacent bins of the second plurality of bins; and dividing the maximum difference in bin count by the particular bin size.

In one example embodiment of a storage medium, the instructions that cause the machine to store the first dataset on the memory device further cause the machine to: identify a dense data range of a parent dataset; and identify the first dataset based on the dense data range of the parent dataset.

In one example embodiment of a storage medium, the instructions that cause the machine to identify the dense data range of the parent dataset further cause the machine to: compute a mean of the parent dataset; compute a standard deviation of the parent dataset; and identify the dense data range of the parent dataset based on the mean and the standard deviation.

In one example embodiment of a storage medium, the instructions that cause the machine to identify the plurality of bin sizes for compressing the first dataset into the second dataset further cause the machine to identify a plurality of bin resolutions, wherein each bin resolution of the plurality of bin resolutions is associated with a percentage of a range size of the first dataset.

In one example embodiment of a storage medium, the optimal bin size is identified to maximize a bin size for binning the first dataset and minimize a difference in a data distribution of the first dataset.

In one example embodiment of a storage medium, the instructions further cause the machine to perform a machine learning operation based on an analysis of the second dataset.

In one example embodiment of a storage medium, the instructions further cause the machine to perform a neural network operation based on an analysis of the second dataset.

In one example embodiment of a storage medium, the instructions further cause the machine to perform a data mining operation based on an analysis of the second dataset.

In one example embodiment of a storage medium, the instructions further cause the machine to identify a relationship for an associative memory based on an analysis of the second dataset.

One or more embodiments may include a system, comprising: a memory to store data; one or more sensors to obtain a plurality of data values; and a processor to: store a first dataset on the memory, wherein the first dataset comprises the plurality of data values; identify a plurality of bin sizes for compressing the first dataset into a second dataset; compute a plurality of performance costs associated with the plurality of bin sizes, wherein each performance cost of the plurality of performance costs is associated with a particular bin size of the plurality of bin sizes; identify a minimum performance cost of the plurality of performance costs; identify an optimal bin size based on the particular bin size associated with the minimum performance cost; partition the first dataset into a plurality of bins based on the optimal bin size; identify a plurality of bin counts associated with the plurality of bins; generate a second dataset based on the plurality of bin counts, wherein the second dataset is smaller than the first dataset; and store the second dataset on the memory, wherein the second dataset is stored using less memory space than the first dataset.

In one example embodiment of a system, the system further comprises an associative memory; and the processor is further to identify a relationship for the associative memory based on an analysis of the second dataset.

One or more embodiments may include a method, comprising: storing a first dataset on a memory device, wherein the first dataset comprises a plurality of data values associated with a computing device; identifying a plurality of bin sizes for compressing the first dataset into a second dataset; computing a plurality of performance costs associated with the plurality of bin sizes, wherein each performance cost of the plurality of performance costs is associated with a particular bin size of the plurality of bin sizes; identifying a minimum performance cost of the plurality of performance costs; identifying an optimal bin size based on the particular bin size associated with the minimum performance cost; partitioning the first dataset into a plurality of bins based on the optimal bin size; identifying a plurality of bin counts associated with the plurality of bins; generating a second dataset based on the plurality of bin counts, wherein the second dataset is smaller than the first dataset; and storing the second dataset on the memory device, wherein the second dataset is stored using less memory space than the first dataset.

In one example embodiment of a method, storing the first dataset on the memory device further comprises: obtaining the plurality of data values for the first dataset from one or more sensor devices; and storing the plurality of data values for the first dataset on the memory device.

In one example embodiment of a method, computing the plurality of performance costs associated with the plurality of bin sizes further comprises: computing each performance cost of the plurality of performance costs by: identifying a second plurality of bins of the particular bin size; identifying a second plurality of bin counts associated with the second plurality of bins; identifying a maximum difference in bin count for adjacent bins of the second plurality of bins; and dividing the maximum difference in bin count by the particular bin size.

What is claimed is:

1. An apparatus, comprising:
a memory to store data; and
a processor to:
store a first dataset on the memory, wherein the first dataset comprises a plurality of data values;
identify a plurality of bin sizes for compressing the first dataset into a second dataset;
compute a plurality of performance costs associated with the plurality of bin sizes, wherein each performance cost of the plurality of performance costs is associated with a particular bin size of the plurality of bin sizes;
identify a minimum performance cost of the plurality of performance costs;
identify an optimal bin size based on the particular bin size associated with the minimum performance cost;
partition the first dataset into a plurality of bins based on the optimal bin size;
identify a plurality of bin counts associated with the plurality of bins;
generate the second dataset based on the plurality of bin counts, wherein the second dataset is smaller than the first dataset; and
store the second dataset on the memory, wherein the second dataset is stored using less memory space than the first dataset.

2. The apparatus of claim 1, wherein the processor to store the first dataset on the memory is further to:
obtain the plurality of data values for the first dataset from one or more sensor devices; and
store the plurality of data values for the first dataset on the memory.

3. The apparatus of claim 1, wherein the processor to compute the plurality of performance costs associated with the plurality of bin sizes is further to:
generate a plurality of histograms associated with binning the first dataset based on the plurality of bin sizes; and
compute the plurality of performance costs based on the plurality of histograms.

4. The apparatus of claim 1, wherein the processor to compute the plurality of performance costs associated with the plurality of bin sizes is further to:
compute each performance cost of the plurality of performance costs by:
identifying a second plurality of bins of the particular bin size;
identifying a second plurality of bin counts associated with the second plurality of bins;
identifying a maximum difference in bin count for adjacent bins of the second plurality of bins; and dividing the maximum difference in bin count by the particular bin size.

5. The apparatus of claim 1, wherein the processor to store the first dataset on the memory is further to:
identify a dense data range of a parent dataset; and
identify the first dataset based on the dense data range of the parent dataset.

6. The apparatus of claim 5, wherein the processor to identify the dense data range of the parent dataset is further to:
compute a mean of the parent dataset;
compute a standard deviation of the parent dataset; and
identify the dense data range of the parent dataset based on the mean and the standard deviation.

7. The apparatus of claim 1, wherein the processor to identify the plurality of bin sizes for compressing the first dataset into the second dataset is further to identify a plurality of bin resolutions, wherein each bin resolution of the plurality of bin resolutions is associated with a percentage of a range size of the first dataset.

8. The apparatus of claim 1, wherein the processor is further to identify a relationship for an associative memory based on an analysis of the second dataset.

9. At least one machine accessible non-transitory storage medium having instructions stored thereon, wherein the instructions, when executed on a machine, cause the machine to:
store a first dataset on a memory device, wherein the first dataset comprises a plurality of data values associated with a computing device;
identify a plurality of bin sizes for compressing the first dataset into a second dataset;
compute a plurality of performance costs associated with the plurality of bin sizes, wherein each performance cost of the plurality of performance costs is associated with a particular bin size of the plurality of bin sizes;
identify a minimum performance cost of the plurality of performance costs;
identify an optimal bin size based on the particular bin size associated with the minimum performance cost;
partition the first dataset into a plurality of bins based on the optimal bin size;
identify a plurality of bin counts associated with the plurality of bins;
generate the second dataset based on the plurality of bin counts, wherein the second dataset is smaller than the first dataset; and
store the second dataset on the memory device, wherein the second dataset is stored using less memory space than the first dataset.

10. The storage medium of claim 9, wherein the instructions that cause the machine to store the first dataset on the memory device further cause the machine to:
obtain the plurality of data values for the first dataset from one or more sensor devices; and
store the plurality of data values for the first dataset on the memory device.

11. The storage medium of claim 9, wherein the instructions that cause the machine to compute the plurality of performance costs associated with the plurality of bin sizes further cause the machine to:
generate a plurality of histograms associated with binning the first dataset based on the plurality of bin sizes; and
compute the plurality of performance costs based on the plurality of histograms.

12. The storage medium of claim 9, wherein the instructions that cause the machine to compute the plurality of performance costs associated with the plurality of bin sizes further cause the machine to:
compute each performance cost of the plurality of performance costs by:
identifying a second plurality of bins of the particular bin size;
identifying a second plurality of bin counts associated with the second plurality of bins;
identifying a maximum difference in bin count for adjacent bins of the second plurality of bins; and
dividing the maximum difference in bin count by the particular bin size.

13. The storage medium of claim 9, wherein the instructions that cause the machine to store the first dataset on the memory device further cause the machine to:
identify a dense data range of a parent dataset; and
identify the first dataset based on the dense data range of the parent dataset.

14. The storage medium of claim 13, wherein the instructions that cause the machine to identify the dense data range of the parent dataset further cause the machine to:
compute a mean of the parent dataset;
compute a standard deviation of the parent dataset; and
identify the dense data range of the parent dataset based on the mean and the standard deviation.

15. The storage medium of claim 9, wherein the instructions that cause the machine to identify the plurality of bin sizes for compressing the first dataset into the second dataset further cause the machine to identify a plurality of bin resolutions, wherein each bin resolution of the plurality of bin resolutions is associated with a percentage of a range size of the first dataset.

16. The storage medium of claim 9, wherein the optimal bin size is identified to maximize a bin size for binning the first dataset and minimize a difference in a data distribution of the first dataset.

17. The storage medium of claim 9, wherein the instructions further cause the machine to perform a machine learning operation based on an analysis of the second dataset.

18. The storage medium of claim 9, wherein the instructions further cause the machine to perform a neural network operation based on an analysis of the second dataset.

19. The storage medium of claim 9, wherein the instructions further cause the machine to perform a data mining operation based on an analysis of the second dataset.

20. The storage medium of claim 9, wherein the instructions further cause the machine to identify a relationship for an associative memory based on an analysis of the second dataset.

21. A system, comprising:
a memory to store data;
one or more sensors to obtain a plurality of data values; and
a processor to:
store a first dataset on the memory, wherein the first dataset comprises the plurality of data values;
identify a plurality of bin sizes for compressing the first dataset into a second dataset;
compute a plurality of performance costs associated with the plurality of bin sizes, wherein each performance cost of the plurality of performance costs is associated with a particular bin size of the plurality of bin sizes;

identify a minimum performance cost of the plurality of performance costs;
identify an optimal bin size based on the particular bin size associated with the minimum performance cost;
partition the first dataset into a plurality of bins based on the optimal bin size;
identify a plurality of bin counts associated with the plurality of bins;
generate the second dataset based on the plurality of bin counts, wherein the second dataset is smaller than the first dataset; and
store the second dataset on the memory, wherein the second dataset is stored using less memory space than the first dataset.

22. The system of claim 21:
wherein the system further comprises an associative memory; and
wherein the processor is further to identify a relationship for the associative memory based on an analysis of the second dataset.

23. A method, comprising:
storing a first dataset on a memory device, wherein the first dataset comprises a plurality of data values associated with a computing device;
identifying a plurality of bin sizes for compressing the first dataset into a second dataset;
computing a plurality of performance costs associated with the plurality of bin sizes, wherein each performance cost of the plurality of performance costs is associated with a particular bin size of the plurality of bin sizes;
identifying a minimum performance cost of the plurality of performance costs;
identifying an optimal bin size based on the particular bin size associated with the minimum performance cost;
partitioning the first dataset into a plurality of bins based on the optimal bin size;
identifying a plurality of bin counts associated with the plurality of bins;
generating the second dataset based on the plurality of bin counts, wherein the second dataset is smaller than the first dataset; and
storing the second dataset on the memory device, wherein the second dataset is stored using less memory space than the first dataset.

24. The method of claim 23, wherein storing the first dataset on the memory device comprises:
obtaining the plurality of data values for the first dataset from one or more sensor devices; and
storing the plurality of data values for the first dataset on the memory device.

25. The method of claim 23, wherein computing the plurality of performance costs associated with the plurality of bin sizes comprises:
computing each performance cost of the plurality of performance costs by:
identifying a second plurality of bins of the particular bin size;
identifying a second plurality of bin counts associated with the second plurality of bins;
identifying a maximum difference in bin count for adjacent bins of the second plurality of bins; and
dividing the maximum difference in bin count by the particular bin size.

\* \* \* \* \*